United States Patent
Yang et al.

(10) Patent No.: US 10,325,535 B2
(45) Date of Patent: *Jun. 18, 2019

(54) CIRCUIT FOR TESTING DISPLAY PANEL, METHOD FOR TESTING DISPLAY PANEL, AND DISPLAY PANEL

(71) Applicants: Shanghai AVIC OPTO Electronics Co., Ltd., Shanghai (CN); Tianma Micro-electronics Co., Ltd., Shenzhen (CN)

(72) Inventors: Xu Yang, Shanghai (CN); Nana Tian, Shanghai (CN); Xupeng Wang, Shanghai (CN); Zhiyong Ren, Shanghai (CN); Xiaoyuan Ding, Shanghai (CN); Zhengyuan Huang, Shanghai (CN)

(73) Assignees: Shanghai AVIC OPTO Electronics Co., Ltd., Shanghai (CN); Tianma Micro-electronics Co., Ltd., Shenzhen (CN)

( * ) Notice: Subject to any disclaimer, the term of this patent is extended or adjusted under 35 U.S.C. 154(b) by 201 days.

This patent is subject to a terminal disclaimer.

(21) Appl. No.: 15/421,123

(22) Filed: Jan. 31, 2017

(65) Prior Publication Data

US 2017/0140688 A1    May 18, 2017

Related U.S. Application Data

(62) Division of application No. 14/566,669, filed on Dec. 10, 2014, now Pat. No. 9,595,215.

(30) Foreign Application Priority Data

Dec. 31, 2013 (CN) .......................... 2013 1 0754377

(51) Int. Cl.
G09G 3/00 (2006.01)
G09G 3/36 (2006.01)
G01R 31/02 (2006.01)

(52) U.S. Cl.
CPC ........... *G09G 3/006* (2013.01); *G01R 31/025* (2013.01); *G09G 3/3614* (2013.01); *G09G 2330/12* (2013.01)

(58) Field of Classification Search
None
See application file for complete search history.

(56) References Cited

U.S. PATENT DOCUMENTS 5,751,261 A    5/1998  Zavracky et al.
6,028,442 A    2/2000  Lee et al.
(Continued)

FOREIGN PATENT DOCUMENTS

CN    101089712 A    12/2007
CN    101726877 A    6/2010
(Continued)

*Primary Examiner* — Paresh H Patel
(74) *Attorney, Agent, or Firm* — Anova Law Group, PLLC (57) ABSTRACT

A method for testing a display panel includes: applying a first level signal to a first sub-pixel and a third sub-pixel of a first pixel unit and applying a second level signal to a second sub-pixel of the first pixel unit; applying the second level signal to a first sub-pixel and a third sub-pixel of a second pixel unit and applying the first level signal to a second sub-pixel of the second pixel unit; and detecting a short circuit between adjacent sub-pixels. The first level signal has a voltage polarity opposite to a voltage polarity of the second level signal. Therefore, it is ensured that any two adjacent sub-pixels have opposite voltage polarities when the short circuit between adjacent sub-pixels of the display (Continued)

panel is detected. The method also provides improved testing abilities to detect an open circuit in a sub-pixel.

3 Claims, 8 Drawing Sheets

(56) References Cited

U.S. PATENT DOCUMENTS

| | | | |
|---|---|---|---|
| 6,075,505 | A | 6/2000 | Shiba et al. |
| 6,424,328 | B1 | 7/2002 | Ino et al. |
| 6,734,925 | B1 | 5/2004 | Lee et al. |
| 7,576,556 | B1 | 8/2009 | Huang et al. |
| 7,626,414 | B2 * | 12/2009 | Lee ................ G02F 1/1345 324/760.01 |
| 7,852,104 | B2 | 12/2010 | Kim |
| 9,275,568 | B2 * | 3/2016 | Peng ................ G09G 3/006 |
| 9,595,215 | B2 * | 3/2017 | Yang ................ G09G 3/006 |
| 2005/0168491 | A1 * | 8/2005 | Takahara .......... G09G 3/006 345/690 |
| 2006/0279322 | A1 | 12/2006 | Lai |
| 2007/0273294 | A1 * | 11/2007 | Nagayama ........ G09G 3/006 315/169.3 |
| 2009/0039348 | A1 | 2/2009 | Lee et al. |

FOREIGN PATENT DOCUMENTS

| | | |
|---|---|---|
| CN | 101727809 A | 6/2010 |
| CN | 102768815 A | 11/2012 |
| CN | 102967954 A | 3/2013 |
| JP | 2008129374 A | 6/2008 |
| KR | 20130020308 A | 2/2013 |

* cited by examiner

FIG. 5 apply the first level signal to the first sub-pixel and the third sub-pixel of the first pixel unit and apply the second level signal to the second sub-pixel of the first pixel unit — S3 apply the first level signal to the first sub-pixel and the third sub-pixel of the second pixel unit, apply the second level signal to the second sub-pixel of the second pixel unit, and detect a broken circuit in each sub-pixel — S4

CIRCUIT FOR TESTING DISPLAY PANEL, METHOD FOR TESTING DISPLAY PANEL, AND DISPLAY PANEL

CROSS-REFERENCES TO RELATED APPLICATIONS

The present application is a divisional application of U.S. patent application Ser. No. 14/566,669, filed on Dec. 10, 2014, which claims the benefit of priority to Chinese Patent Application No. 201310754377.1, entitled "CIRCUIT FOR TESTING DISPLAY PANEL, METHOD FOR TESTING DISPLAY PANEL, AND DISPLAY PANEL", filed on Dec. 31, 2013 with State Intellectual Property Office of People's Republic of China, which is incorporated herein by reference in its entirety.

BACKGROUND OF THE INVENTION

A liquid crystal display (LCD) device is a flat panel display widely used in a laptop or a cell phone at present. Due to the large market demand, the manufacturing process of the LCD device and a design of panel structures are continuously improved. For ensuring a display quality of the LCD, a light-on testing process is performed during the manufacture of a display panel, to determine whether pixels of the display panel can perform a normal operation. However, the conventional technology has a poor ability for testing the display panel.

DETAILED DESCRIPTION OF THE PREFERRED EMBODIMENTS

As described in the background, the conventional technology has a poor ability for testing a display panel.

Figure 1:
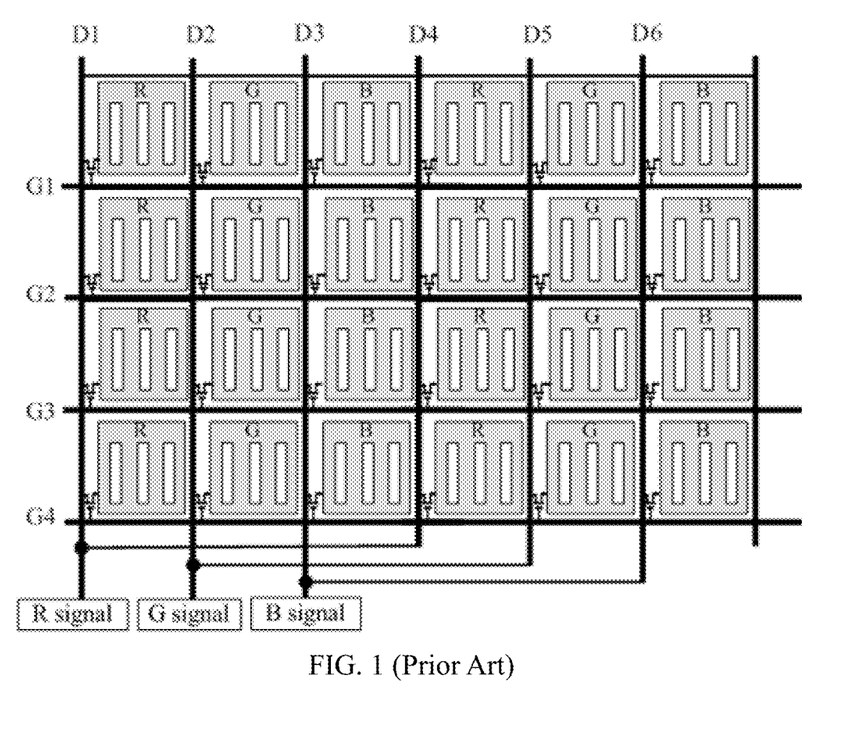
FIG. 1 is a top view diagram of a conventional display panel.

As shown in FIG. 1, a conventional display panel includes multiple pixel units. Each pixel unit includes three sub-pixels, i.e., an R pixel, a G pixel, and a B pixel. Each sub-pixel is connected to one data line D. All data lines connected to R pixels are electrically connected to receive an R signal, all data lines connected to G pixels are electrically connected to receive a G signal, and all data lines connected to B pixels are electrically connected to receive a B signal.

Figure 2:
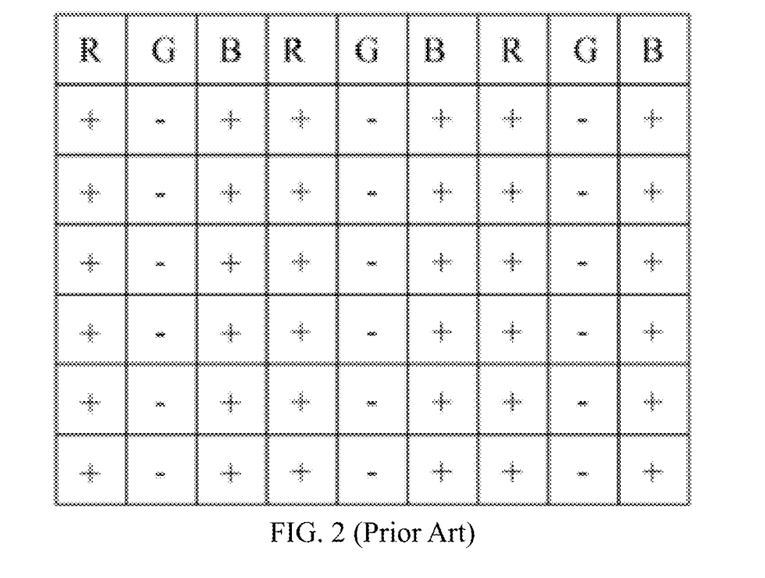
FIG. 2 is a diagram showing voltage polarities of respective pixels of a display panel during a test of the display panel with a conventional technology.
Figure 3:
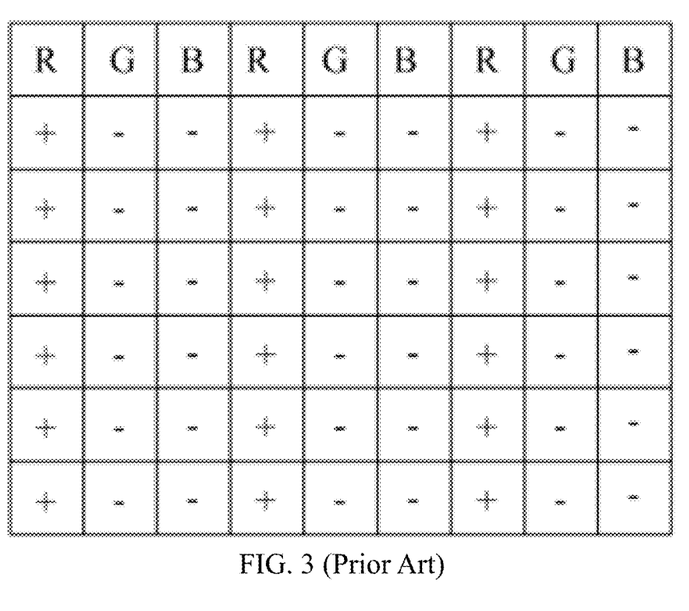
FIG. 3 is a diagram showing another voltage polarities of respective pixels of a display panel during a test of the display panel with a conventional technology.

In the conventional technology, drive signals are respectively applied to R pixels, G pixels, and B pixels, when a light-on test is performed on the display panel. In the case that the R signal is a high-level signal and the G signal is a low-level signal, the R pixels have a voltage polarity opposite to a voltage polarity of the G pixels. In this case, if the B signal is the high-level signal, the B pixels have the same voltage polarity with the R pixels, as shown in FIG. 2. Therefore, any short circuit between the B pixels and the R pixels may not be determined. Alternatively, if the B signal is the low-level signal, the B pixels have the same voltage polarity with the G pixels, as shown in FIG. 3. Therefore, any short circuit between the B pixels and the G pixels may not be determined. Similarly, in the case that the R signal is the low-level signal and the G signal is the high-level signal, there still exist adjacent pixels having the same voltage polarity, and consequently, any short circuit between the adjacent pixels having the same voltage polarity may not be determined. Hence, the conventional technology has a poor ability for testing the display panel.

In view of this problem, the present invention provides a method for testing a display panel. The display panel includes multiple pixel units. A pixel unit includes a first pixel unit and a second pixel unit adjacent to the first pixel unit in a first direction. Each of the first pixel unit and the second pixel unit includes a first sub-pixel, a second sub-pixel and a third sub-pixel. The second sub-pixel is located between the first sub-pixel and the third sub-pixel. The method includes:

applying a first level signal to the first sub-pixel of the first pixel unit and the third sub-pixel of the first pixel unit and applying a second level signal to the second sub-pixel of the first pixel unit; and applying the second level signal to the first sub-pixel of the second pixel unit and the third sub-pixel of the second pixel unit, applying the first level signal to the second sub-pixel of the second pixel unit, and detecting a short circuit between adjacent sub-pixels.

The first level signal has a voltage polarity opposite to a voltage polarity of the second level signal.

In this way, when a short circuit between adjacent sub-pixels of the display panel is detected by using the technical solution according to the embodiments of the disclosure, the first level signal is applied to the first sub-pixel and the third sub-pixel of the first pixel unit, the second level signal is applied to the second sub-pixel of the first pixel unit, as well as the second level signal is applied to the first sub-pixel and the third sub-pixel of the second pixel unit, and the first level signal is applied to the second sub-pixel of the second pixel unit. The first level signal has a voltage polarity opposite to a voltage polarity of the second level signal. In this way, it is ensured that voltages applied to any two adjacent sub-pixels have opposite voltage polarities when the short circuit between adjacent sub-pixels of the display panel is detected. Therefore, any short circuit between adjacent sub-pixels may be determined. In this way, an ability of testing the display panel may be improved.

For making the foregoing objectives, features and advantages of the disclosure more clear and understandable, the embodiments of the disclosure are illustrated hereinafter in conjunction with drawings.

Details will be illustrated in the following description to fully understand the solution. The disclosure may be implemented with other approaches different from those given in the description. Those skilled in the art may expand the disclosure without departing from the conception of the disclosure. Hence, the disclosure is not limited to the embodiments disclosed hereinafter.

Figure 4:
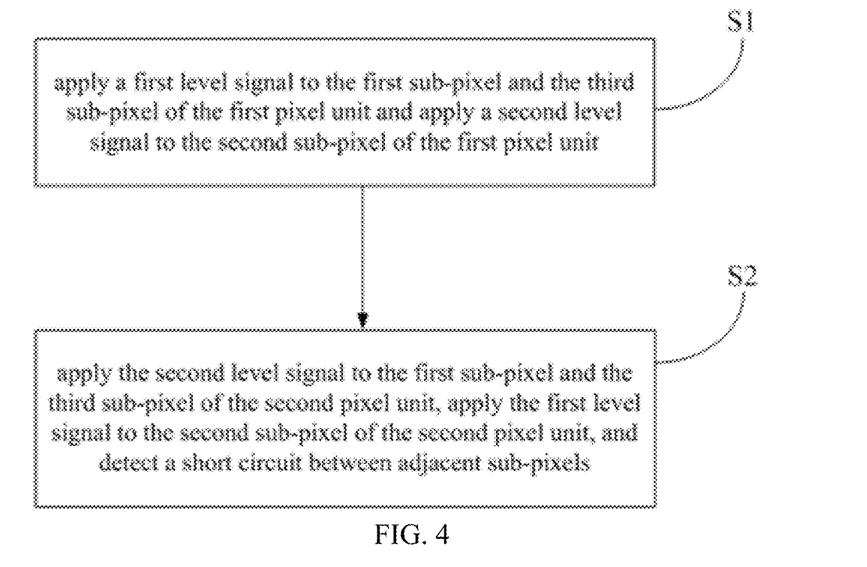
FIG. 4 is a flowchart of a method for testing a display panel according to an embodiment of the disclosure.

FIG. 4 illustrates a method for testing a display panel according to an embodiment of the disclosure. The display panel includes multiple pixel units. The multiple pixel units include a first pixel unit and a second pixel unit adjacent to the first pixel unit in a first direction. Each of the first pixel unit and the second pixel unit includes a first sub-pixel, a second sub-pixel, and a third sub-pixel. The second sub-pixel is located between the first sub-pixel and the third sub-pixel. The method includes steps S1 and S2.

In the step S1, a first level signal is applied to the first sub-pixel of the first pixel unit and the third sub-pixel of the first pixel unit, and a second level signal is applied to the second sub-pixel of the first pixel unit.

In the step S2, the second level signal is applied to the first sub-pixel of the second pixel unit and the third sub-pixel of the second pixel unit, the first level signal is applied to the second sub-pixel of the second pixel unit, and a short circuit between adjacent sub-pixels is detected.

The first level signal has a voltage polarity opposite to a voltage polarity of the second level signal.

It should be noted that, according to the embodiment of the disclosure, the first direction may be a horizontal direction or a vertical direction. The first direction is set based on a direction of data lines, and can be in others as well in the disclosure.

In addition, the method for testing the display panel according to the embodiment of the disclosure is illustrated by taking that the first sub-pixel is R pixel, the second sub-pixel is G pixel, and the third sub-pixel is B pixel as an example. In practice, the first sub-pixel may be the R pixel, the G pixel, or the B pixel; the second sub-pixel may be the R pixel, the G pixel, or the B pixel; and the third sub-pixel may also be the R pixel, the G pixel, or the B pixel. The first sub-pixel, the second sub-pixel and the third sub-pixel will not be limited herein, as long as the first sub-pixel, the second sub-pixel and the third sub-pixel may respectively correspond to the R pixel, the G pixel, or the B pixel.

With the method for testing the display panel according to the embodiment of the disclosure, the first level signal is applied to the first sub-pixel of the first pixel unit and the third sub-pixel of the first pixel unit, and the second level signal is applied to the second sub-pixel of the first pixel unit. The second sub-pixel is located between the first sub-pixel and the third sub-pixel. The first level signal has a voltage polarity opposite to a voltage polarity of the second level signal. Hence, when a short circuit of the display panel is detected with the method for testing the display panel according to the embodiment of the disclosure, it is ensured that adjacent sub-pixels in the first pixel unit have opposite voltage polarities.

Similarly, with the method for testing the display panel according to the embodiment of the disclosure, the second level signal is applied to the first sub-pixel of the second pixel unit and the third sub-pixel of the second pixel unit, and the first level signal is applied to the second sub-pixel of the second pixel unit. The second sub-pixel is located between the first sub-pixel and the third sub-pixel. The first level signal has a voltage polarity opposite to a voltage polarity of the second level signal. Hence, when a short circuit of the display panel is detected with the method for testing the display panel according to the embodiment of the disclosure, it is ensured that adjacent sub-pixels in the second pixel unit have opposite voltage polarities.

In addition, when a short circuit of the display panel is detected, the first pixel unit is adjacent to the second pixel unit, the first level signal is applied to the first sub-pixel of the first pixel unit and the third sub-pixel of the first pixel unit, the second level signal is applied to the first sub-pixel of the second pixel unit and the third sub-pixel of the second pixel unit, and the first level signal has a voltage polarity opposite to a voltage polarity of the second level signal. Hence, when a short circuit of the display panel is detected with the method for testing the display panel according to the embodiment of the disclosure, it is ensured that any two adjacent sub-pixels of the first and second pixel units have opposite voltage polarities.

Figure 5:
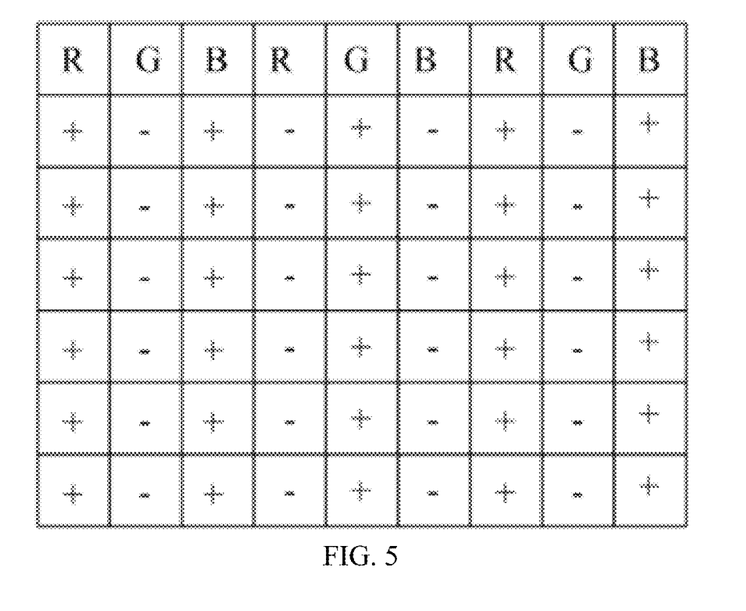
FIG. 5 is a diagram showing voltage polarities of respective pixels of a display panel during a test of the display panel with a method for testing the display panel according to an embodiment of the disclosure.

In this way, when a short circuit of adjacent sub-pixels of the display panel is detected with the method according to the embodiment of the disclosure, it is ensured that any two adjacent sub-pixels of the display panel have opposite voltage polarities, as shown in FIG. 5. Therefore, any short circuit between adjacent sub-pixels of the display panel may be determined with accuracy, and an ability of testing the display panel may be improved.

Figure 6:
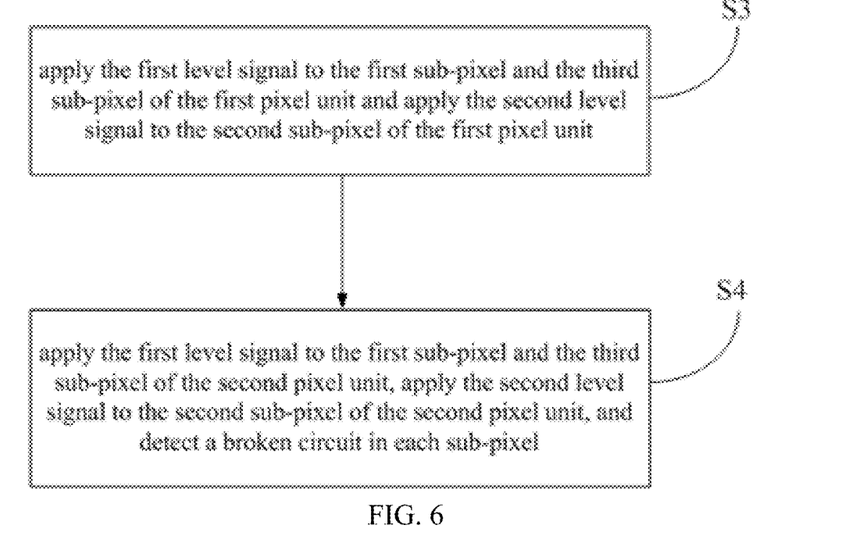
FIG. 6 is a flowchart of a method for testing a display panel according to an embodiment of the disclosure.

According to an embodiment of the disclosure, as shown in FIG. 6, the method for testing the display panel further includes steps S3 and S4.

In step S3, the first level signal is applied to the first sub-pixel of the first pixel unit and the third sub-pixel of the first pixel unit, and the second level signal is applied to the second sub-pixel of the first pixel unit.

In step S4, the first level signal is applied to the first sub-pixel of the second pixel unit and the third sub-pixel of the second pixel unit, the second level signal is applied to the second sub-pixel of the second pixel unit, and an open circuit in each sub-pixel is detected.

The first level signal has a voltage polarity opposite to a voltage polarity of the second level signal.

When an open circuit in each sub-pixel is detected in the display panel with the method for testing the display panel according to the embodiment of the disclosure, the first level signal is applied to the first sub-pixels and the third sub-pixels of both the first and the second pixel units, and the second level signal is applied to the second sub-pixels in both the first pixel unit and the second pixel unit. The first level signal has a voltage polarity opposite to a voltage polarity of the second level signal. Hence, when the open circuit in the display panel is detected with the method for testing the display panel according to the embodiment of the disclosure, the voltage applied to the first sub-pixels and the third sub-pixels is a constant positive signal, and the voltage applied to the second sub-pixels is a constant negative signal. Alternatively, the voltage applied to the first sub-pixels and the third sub-pixels is a constant negative signal, and the voltage applied to the second sub-pixels is a constant positive signal. Therefore, the open circuit in each sub-pixel is detected effectively in the display panel.

It should be noted that, in the method for testing the display panel according to the embodiment of the disclosure, the first level signal may be a positive signal or a negative signal. In one embodiment, the first level signal is a positive signal and the second level signal is a negative signal. In another embodiment, the first level signal is a negative signal and the second level signal is a positive signal. The disclosure is not limited herein.

With the method for testing the display panel according to the embodiment of the disclosure, any short circuit between adjacent sub-pixels of the display panel may be detected with accuracy and any open circuit in each sub-pixel may be detected in the display panel. In this way, the ability of testing the display panel is enhanced.

Figure 7:
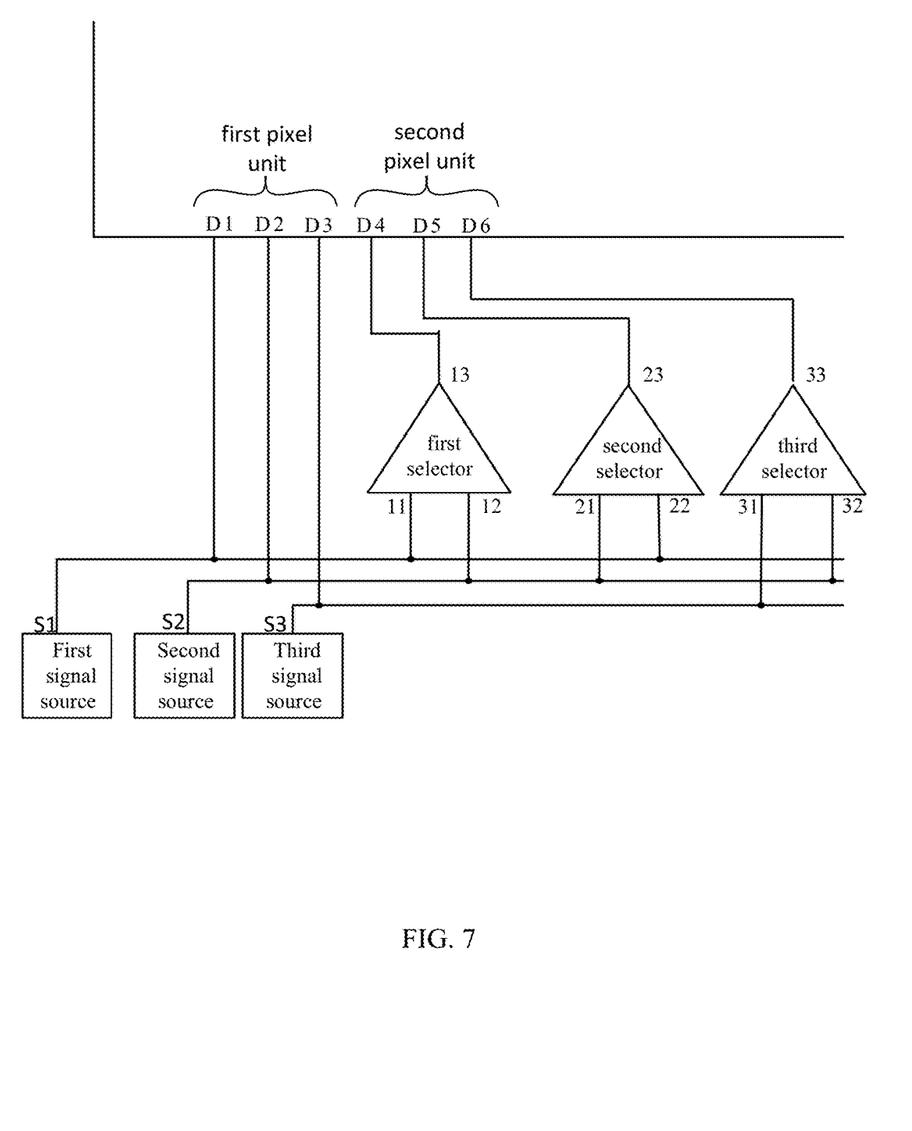
FIG. 7 is a schematic structure diagram of a circuit for testing a display panel according to an embodiment of the disclosure.

A circuit for testing a display panel is provided. The display panel includes multiple pixel units. The multiple pixel units each include a first pixel unit and a second pixel unit adjacent to the first pixel unit in a first direction. Each of the first pixel unit and the second pixel unit includes a first sub-pixel, a second sub-pixel and a third sub-pixel. The second sub-pixel is located between the first sub-pixel and the third sub-pixel. As shown in FIG. 7, the circuit for testing the display panel includes:

- a first signal source including an output end S1 directly connected to the source D1 of the first sub-pixel of the first pixel unit;
- a second signal source including an output end S2 directly connected to the source D2 of the second sub-pixel of the first pixel unit;
- a third signal source including an output end S3 directly connected to the source D3 of the third sub-pixel of the first pixel unit;
- a first selector including an output end 13 directly connected to the source D4 of the first sub-pixel of the second pixel unit, a first input end 11 of the first selector connected to the output end S1 of the first signal source, and a second input end 12 of the output end S2 of the first selector connected to the second signal source;
- a second selector including an output end 23 directly connected to the source D5 of the second sub-pixel of the second pixel unit, a first input end 21 connected to the output end S2 of the second signal source, and a second input end 22 connected to the output end S1 of the first signal source; and
- a third selector including an output end 33 directly connected to the source D6 of the third sub-pixel of the second pixel unit, a first input end 31 connected to the output end S3 of the third signal source, and a second input end 32 connected to the output end S2 of the second signal source.

The first signal source and the third signal source output a first level signal, and the second signal source outputs a second level signal. The first level signal has a voltage polarity opposite to a voltage polarity of the second level signal.

It should be noted that, the circuit for testing the display panel according to the embodiment of the disclosure is illustrated by taking that the first sub-pixel is R pixel, the second sub-pixel is G pixel, and the third sub-pixel is B pixel as an example. In practice, the first sub-pixel may be the R pixel, the G pixel, or the B pixel; the second sub-pixel may be the R pixel, the G pixel, or the B pixel; and the third sub-pixel may also be the R pixel, the G pixel, or the B pixel. The first sub-pixel, the second sub-pixel, and the third sub-pixel will not be limited in the disclosure, as long as the first sub-pixel, the second sub-pixel, and the third sub-pixel may respectively correspond to the R pixel, the G pixel, or the B pixel.

When the display panel is tested by the circuit for testing the display panel according to the embodiment of the disclosure, during a first time period, the first selector is controlled to electrically connect the first input end 11 with the output end 13, the second selector is controlled to electrically connect the first input end 21 with the output end 23, and the third selector is controlled to electrically connect the first input end 31 with the output end 33. In this case, the first sub-pixel of the first pixel unit is connected to the first signal source, the second sub-pixel of the first pixel unit is connected to the second signal source, and the third sub-pixel of the first pixel unit is connected to the third signal source. The first sub-pixel, the second sub-pixel and the third sub-pixel of the second pixel unit are also respectively connected to the first signal source, the second signal source and the third signal source. In this way, the first level signal is applied to the first sub-pixel of the first pixel unit and the third sub-pixel of the first pixel unit, the second level signal is applied to the second sub-pixel of the first pixel unit, as well as the first level signal is applied to the first sub-pixel of the second pixel unit and the third sub-pixel of the second pixel unit, and the second level signal is applied to the second sub-pixel of the second pixel unit. Accordingly, an open circuit in each sub-pixel of the display panel may be detected.

In addition, when the display panel is tested by the circuit for testing the display panel according to the embodiment of the disclosure, in a second time period, the first selector is controlled to electrically connect the second input end 12 with the output end 13, the second selector is controlled to electrically connect the second input end 22 with the output end 23, and the third selector is controlled to electrically connect the second input end 32 with the output end 33. In this case, the first sub-pixel of the first pixel unit is connected to the first signal source, the second sub-pixel of the first pixel unit is connected to the second signal source and the third sub-pixel of the first pixel unit is connected to the third signal source. The first sub-pixel of the second pixel unit is connected to the second signal source, the second sub-pixel of the second pixel unit is connected to the first signal source, and the third sub-pixel of the second pixel unit is connected to the second signal source. In this way, the first level signal is applied to the first sub-pixel and the third sub-pixel of the first pixel unit, the second level signal is applied to the second sub-pixel of the first pixel unit, as well as the second level signal is applied to the first sub-pixel and the third sub-pixel of the second pixel unit, and the first level signal is applied to the second sub-pixel of the second pixel unit. Accordingly, it is ensured that any two adjacent sub-pixels of the display panel have opposite voltage polarities, and a short circuit between the sub-pixels of the display panel may be detected.

Figure 8:
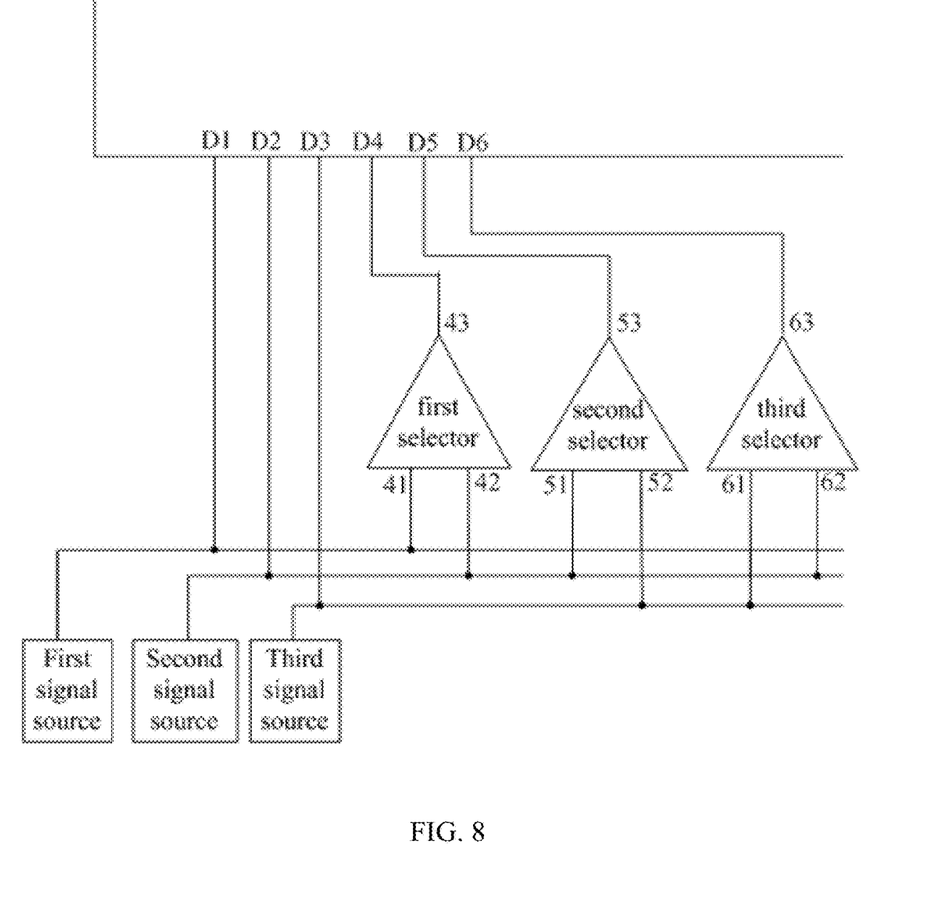
FIG. 8 is a schematic structure diagram of a circuit for testing a display panel according to an embodiment of the disclosure.

According to another embodiment of the disclosure, as shown in FIG. 8, the circuit for testing the display panel includes:

- a first signal source including an output end S1 directly connected to the source D1 of the first sub-pixel of the first pixel unit;
- a second signal source including an output end S2 directly connected to the source D2 of the second sub-pixel of the first pixel unit;
- a third signal source including an output end S3 directly connected to the source D3 of the third sub-pixel of the first pixel unit;
- a first selector including an output end 43 directly connected to the source D4 of the first sub-pixel of the second pixel unit, a first input end 41 connected to the output end S1 of the first signal source, and a second input end 42 connected to the output end S2 of the second signal source;

a second selector including an output end 53 directly connected to the source D5 of the second sub-pixel of the second pixel unit, a first input end 51 connected to the output end S2 of the second signal source, and a second input end 52 connected to the output end S3 of the third signal source; and a third selector including an output end 63 directly connected to the source D6 of the third sub-pixel of the second pixel unit, a first input end 61 connected to the output end S3 of the third signal source, and a second input end 62 connected to the output end S2 of the second signal source.

The first signal source and the third signal source output a first level signal, and the second signal source outputs a second level signal. The first level signal has a voltage polarity opposite to a voltage polarity of the second level signal.

When the display panel is tested by the circuit for testing the display panel according to the embodiment of the disclosure, during a first time period, the first selector is controlled to electrically connect the first input end 41 with the output end 43, the second selector is controlled to electrically connect the first input end 51 with the output end 53, and the third selector is controlled to electrically connect the first input end 61 with the output end 63. Accordingly, an open circuit in each sub-pixel of the display panel is detected. In this case, the first sub-pixel of the first pixel unit is connected to the first signal source, the second sub-pixel of the first pixel unit is connected to the second signal source, and the third sub-pixel of the first pixel unit is connected to the third signal source. The first sub-pixel, the second sub-pixel and the third sub-pixel of the second pixel unit are also respectively connected to the first signal source, the second signal source and the third signal source. In this way, the first level signal is applied to the first sub-pixel of the first pixel unit and the third sub-pixel of the first pixel unit, the second level signal is applied to the second sub-pixel of the first pixel unit, as well as the first level signal is applied to the first sub-pixel of the second pixel unit and the third sub-pixel of the second pixel unit, and the second level signal is applied to the second sub-pixel of the second pixel unit. Accordingly, an open circuit in each sub-pixel of the display panel may be detected.

In addition, when the display panel is tested by the circuit for testing the display panel according to the embodiment of the disclosure, during a second time period, the first selector is controlled to electrically connect the second input end 42 with the output end 43, the second selector is controlled to electrically connect the second input end 52 with the output end 53, and the third selector is controlled to electrically connect the second input end 62 with the output end 63. In this case, the first sub-pixel of the first pixel unit is connected to the first signal source, the second sub-pixel of the first pixel unit is connected to the second signal source and the third sub-pixel of the first pixel unit is connected to the third signal source. The first sub-pixel of the second pixel unit is connected to the second signal source, the second sub-pixel of the second pixel unit is connected to the third signal source, and the third sub-pixel of the second pixel unit is connected to the second signal source. Both the third signal source and the first signal source output the first level signal. In this way, the first level signal is applied to the first sub-pixel and the third sub-pixel of the first pixel unit, the second level signal is applied to the second sub-pixel of the first pixel unit, as well as the second level signal is applied to the first sub-pixel and the third sub-pixel of the second pixel unit, and the first level signal is applied to the second sub-pixel of the second pixel unit. Accordingly, it is ensured that any two adjacent sub-pixels of the display panel have opposite voltage polarities, and a short circuit between the sub-pixels of the display panel is detected.

It should be noted that, in the circuit for testing the display panel according to the embodiments of the disclosure, the first selector, the second selector, and the third selector may be automatically or manually controlled. The first selector, the second selector, and the third selector can be semi-automatically controlled depending on circumstances.

Furthermore, in the circuit for testing the display panel according to an embodiment of the disclosure, the first selector may be a single-pole double-throw switch, an either-or selector, a relay, or any other selector, as well as the second selector or the third selector may also be a single-pole double-throw switch, an either-or selector, a relay, or any other selector, which is not limited herein. In the case that the first selector, the second selector, and the third selector are single-pole double-throw switches, the first selector, the second selector and the third selector may be controlled manually. In the case that the first selector, the second selector and the third selector are either-or selectors or relays, the first selector, the second selector and the third selector may be controlled automatically.

Figure 9:
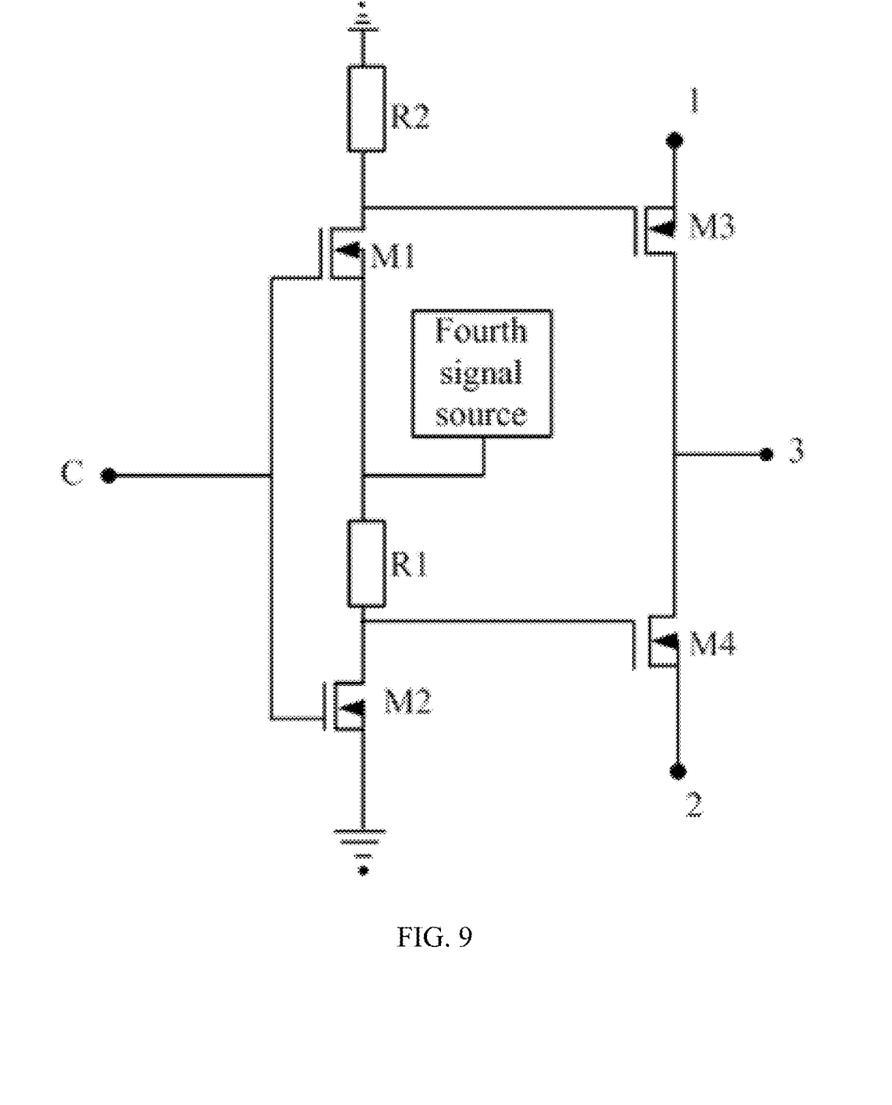
FIG. 9 is a schematic structure diagram of an either-or selector in a circuit for testing a display panel according to an embodiment of the disclosure.

As shown in FIG. 9, the either-or selector according to an embodiment of the disclosure includes a first thin film transistor M1, a second thin film transistor M2, a fourth signal source, a third thin film transistor M3, and a fourth thin film transistor M4.

The gate of the first thin film transistor M1 is connected with the gate of the second thin film transistor M2. The gate of the first thin film transistor M1 and the gate of the second thin film transistor M2 are connected to a control signal input end C of the either-or selector. The drain of the first thin film transistor M1 is connected to a ground potential (alternatively referred to as ground) via a second resistor R2. The source of the first thin film transistor M1 is connected to the drain of the second thin film transistor M2 via a first resistor R1. The source of the second thin film transistor M2 is connected to ground.

The fourth signal source is connected to the source of the first thin film transistor M1, and is connected to the drain of the second thin film transistor M2 via the first resistor R1.

The source of the third thin film transistor M3 is used as a first input end 1 of the either-or selector. The gate of the third thin film transistor M3 is connected to the drain of the first thin film transistor M1, and is connected to ground via the second resistor R2. The source of the fourth thin film transistor M4 is used as a second input end 2 of the either-or selector. The gate of the fourth thin film transistor M4 is connected to the fourth signal source via the first resistor R1, and is connected to the drain of the second thin film transistor M2. The drain of the third thin film transistor M3 is connected to the drain of the fourth thin film transistor M4, and is used as an output end 3 of the either-or selector.

When a high level signal is applied to the control signal input end C of the either-or selector, the high level signal is applied to the gate of the first thin film transistor M1 and the gate of the second thin film transistor M2, and both the first thin film transistor M1 and the second thin film transistor M2 are turned on. In this case, a gate voltage of the third thin film transistor M3 is an output voltage of the fourth signal source, and the gate of the fourth thin film transistor M4 is connected to ground. The third thin film transistor M3 is on and the fourth thin film transistor M4 is off, the first input end 1, rather than the second input end 2, is electrically connected with the output end 3. Therefore, the first sub-pixel, the second sub-pixel and the third sub-pixel of the second pixel unit are respectively connected to the first signal source, the second signal source and the third signal source.

When a low level signal is applied to the control signal input end C of the either-or selector, the low level signal is applied to the gates of the first thin film transistor M1 and the second thin film transistor M2, and both the first thin film transistor M1 and the second thin film transistor M2 are turned off. In this case, the gate of the third thin film transistor M3 is connected to ground via the second resistor R2, and the gate of the fourth thin film transistor M4 is connected to the fourth signal resource via the first resistor R1. Accordingly, the third thin film transistor M3 is off and the fourth thin film transistor M4 is on, the second input end 2, rather than the first input end 1, is electrically connected with the output end 3. Therefore, the first sub-pixel of the second pixel unit is connected to the second signal source, the second sub-pixel of the second pixel unit is connected to the first signal source or the third signal source, and the third sub-pixel of the second pixel unit is connected to the second signal source.

It should be noted that, according to the embodiment, the first resistor R1 and the second resistor R2 are provided as current-limiting resistors to prevent the first thin film transistor M1, the second thin film transistor M2, the third thin film transistor M3, and the fourth thin film transistor M4 from being damaged by a large current. It should be further noted that, the fourth signal source supplies a DC voltage of 5 Volts. The fourth signal source will not be limited herein, as long as the fourth signal source may output a constant high level signal.

Figure 10:
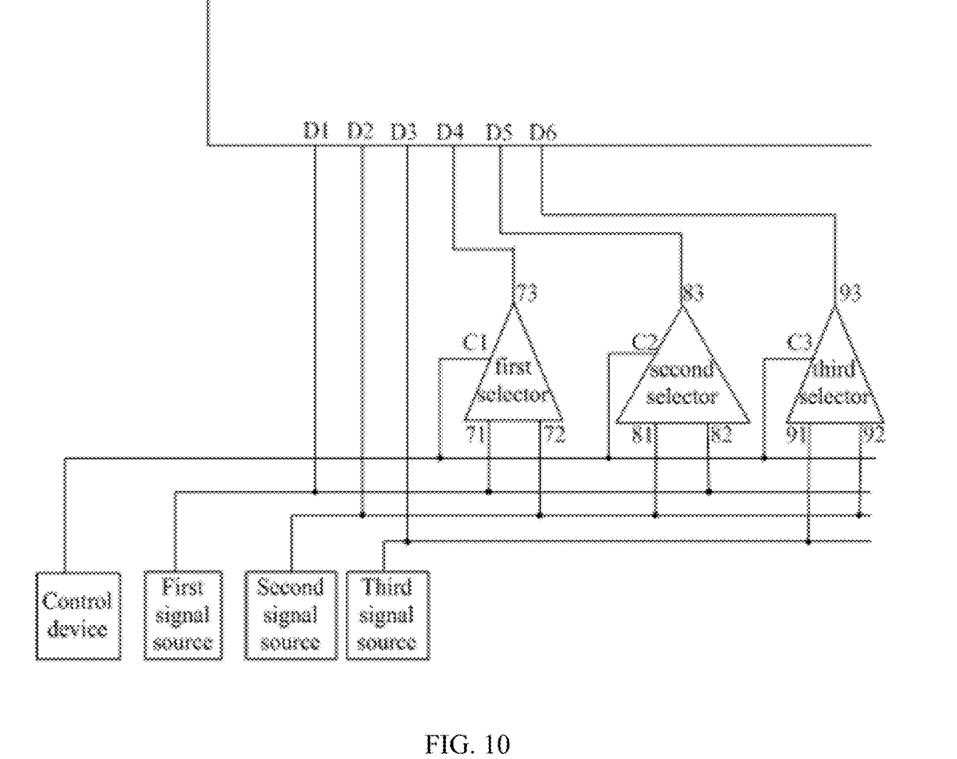
FIG. 10 is a schematic structure diagram of a circuit for testing a display panel according to an embodiment of the disclosure.

According to yet another embodiment of the disclosure, as shown in FIG. 10, a circuit for testing a display panel further includes a control device connected with the control signal input end C1 of the first selector, the control signal input end C2 of the second selector and the control signal input end C3 of the third selector. The control device is used to apply a high level signal or a low level signal to the control signal input end C1 of the first selector, the control signal input end C2 of the second selector and the control signal input end C3 of the third selector. In this way, each of the first selector, the second selector and the third selector may electrically connect the first input end 1 or the second input end 2 with the output end 3 in different time periods.

Figure 11:
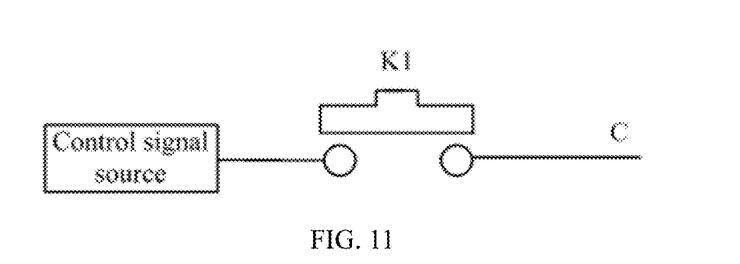
FIG. 11 is a schematic structure diagram of a control device in the circuit for testing the display panel according to an embodiment of the disclosure.

According to an embodiment of the disclosure, as shown in FIG. 11, the control device includes a first switch K1 connected to the control signal input ends C of the first selector, the second selector and the third selector, and a control signal source connected to an input end of the first switch K1. The control signal source outputs a constant high level signal.

In the case that the first switch K1 is on, the control signal source is electrically connected with the control signal input ends C of the first selector, the second selector and the third selector. The high level signal is applied to the control signal input ends C of the first selector, the second selector and the third selector. In the case that the first switch K1 is off, the control signal source is not connected to the control signal input ends C of the first selector, the second selector and the third selector. A low level signal is applied to the control signal input end C of the first selector, the second selector and the third selector.

Figure 12:
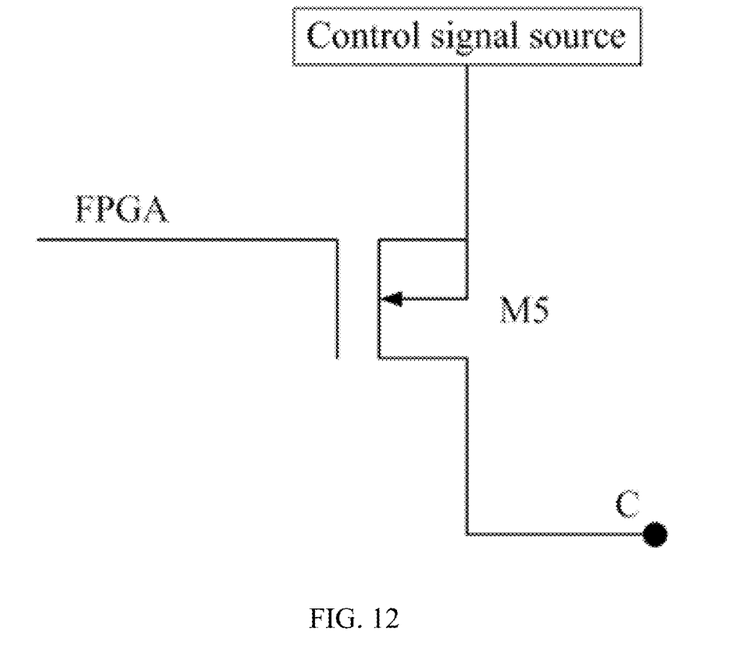
FIG. 12 is a schematic structure diagram of another control device in the circuit for testing the display panel according to an embodiment of the disclosure.

According to another embodiment of the disclosure, as shown in FIG. 12, the control device includes: a fifth thin film transistor M5 including the drain connected to the control signal input ends C of the first selector, the second selector and the third selector, a control signal source connected to the source of the fifth thin film transistor M5, and a field programmable gate array (FPGA) controller connected to the gate of the fifth thin film transistor M5. The control signal source outputs a constant high level signal.

In the case that the FPGA controller outputs a high level signal, the fifth thin film transistor M5 is off, the control signal source is not connected to the control signal input ends C of the first selector, the second selector and the third selector, and a low level signal is applied to the control signal input ends C of the first selector, the second selector and the third selector. In the case that the FPGA controller outputs a low level signal, the fifth thin film transistor M5 is on, the control signal source is electrically connected to the control signal input end C of each of the first selector, the second selector and the third selector, and accordingly, the control signal source applies the high level signal to the control signal input ends C of the first selector, the second selector and the third selector.

The control signal source applies a DC voltage of 5 Volts. the DC voltage can be other voltage levels, as long as the control signal source may output a constant high level signal.

A display panel is further provided in an embodiment of the disclosure. The display panel includes the circuit according to the foregoing embodiments.

With the display panel and the circuit for testing the display panel, any short circuit between adjacent sub-pixels of the display panel may be determined with accuracy, and any open circuit in each sub-pixel of the display panel may also be determined. Accordingly, the ability of testing the display panel is improved.

Various parts of the specification are described progressively. Differences from other parts are highlighted in each part, while same or similar parts may be referred to each other.

Those skilled in the art can implement or use the disclosure with the above description of the embodiments of the disclosure. Various modifications to the embodiments are obvious for those skilled in the art. The general principle defined in the specification may be embodied in a variety of other forms without departing from the spirit or scope of the disclosure. Therefore, the disclosure can be in others as well, and the disclosure is intended to protect a widest range in accordance with the principle and novelties disclosed in the specification.

What is claimed is:

1. A method for testing a display panel using a circuit, wherein the display panel comprises a plurality of pixel units, the pixel unit comprises a first pixel unit and a second pixel unit adjacent to the first pixel unit in a first direction, each of the first pixel unit and the second pixel unit comprises a first sub-pixel, a second sub-pixel, and a third sub-pixel, and the second sub-pixel is located between the first sub-pixel and the third sub-pixel; and wherein the method comprises:

applying a first level signal to the first sub-pixel of the first pixel unit and the third sub-pixel of the first pixel unit and applying a second level signal to the second sub-pixel of the first pixel unit, applying the second level signal to the first sub-pixel of the second pixel unit and the third sub-pixel of the second pixel unit and applying the first level signal to the second sub-pixel of the second pixel unit, and
detecting a short circuit between adjacent sub-pixels;
wherein the circuit comprises:
  a first signal source comprising an output end directly connected to a source of the first sub-pixel of the first pixel unit,
  a second signal source comprising an output end directly connected to a source of the second sub-pixel of the first pixel unit,
  a third signal source comprising an output end directly connected to a source of the third sub-pixel of the first pixel unit,
  a first selector comprising an output end directly connected to a source of the first sub-pixel of the second pixel unit, a first input end connected to the first signal source, and a second input end connected to the second signal source,
  a second selector comprising an output end directly connected to a source of the second sub-pixel of the second pixel unit, a first input end connected to the second signal source, and a second input end connected to the first signal source or the third signal source, and
  a third selector comprising an output end directly connected to a source of the third sub-pixel of the second pixel unit, a first input end connected to the third signal source, and a second input end connected to the second signal source,
  wherein the first signal source and the third signal source output the first level signal, the second signal source outputs the second level signal, and the first level signal has a voltage polarity opposite to a voltage polarity of the second level signal.

2. The method according to claim 1, further comprising:
  applying the first level signal to the first sub-pixel of the first pixel unit and the third sub-pixel of the first pixel unit and applying the second level signal to the second sub-pixel of the first pixel unit,
  applying the first level signal to the first sub-pixel of the second pixel unit and the third sub-pixel of the second pixel unit and applying the second level signal to the second sub-pixel of the second pixel unit, and
  detecting an open circuit in each sub-pixel.

3. The method according to claim 1, wherein the first level signal is a positive voltage signal and the second level signal is a negative voltage signal; or the first level signal is a negative voltage signal and the second level signal is a positive voltage signal.

\* \* \* \* \*